United States Patent
Yu et al.

(10) Patent No.: US 6,252,770 B1
(45) Date of Patent: Jun. 26, 2001

(54) ELECTRONIC APPARATUS COOLING DEVICE

(75) Inventors: Ming-Chuan Yu, 16F-6, No. 1071, Chung Cheng Road, Taoyaun; Chung Che Yu, Taipei Hsien, both of (TW)

(73) Assignee: Ming-Chuan Yu, Taoyuan (TW)

( * ) Notice: Subject to any disclaimer, the term of this patent is extended or adjusted under 35 U.S.C. 154(b) by 0 days.

(21) Appl. No.: 09/631,648

(22) Filed: Aug. 2, 2000

(51) Int. Cl.[7] ........................................ H05K 7/20
(52) U.S. Cl. ..................... 361/695; 361/687; 361/692; 361/683; 257/713; 174/15.2
(58) Field of Search .................... 361/683, 685, 361/687, 692, 695, 727; 257/706–727; 174/15.1, 15.2, 252, 16.3; 165/104.21, 104.26, 104.32, 104.33, 104.34, 185; 454/184; 417/360, 423.5, 423.14, 423.7; 415/231.1, 223; 312/223.1; 340/607; 307/66, 125; 351/82

(56) References Cited
U.S. PATENT DOCUMENTS

| | | | |
|---|---|---|---|
| 5,409,419 | * | 4/1995 | Euchner et al. ................. 454/184 |
| 5,540,548 | * | 7/1996 | Eberhardt et al. ............... 415/184 |
| 5,562,410 | * | 10/1996 | Sachs et al. .................. 415/213.1 |
| 5,772,500 | * | 6/1998 | Harvey et al. .................. 454/184 |
| 5,788,467 | * | 8/1998 | Zenitani et al. ................ 417/360 |
| 5,876,278 | * | 3/1999 | Cheng ........................... 454/184 |
| 5,955,955 | * | 9/1999 | Corcoran et al. ................ 340/607 |
| 6,042,474 | * | 3/2000 | Harvey et al. .................. 454/184 |

\* cited by examiner

Primary Examiner—Leo P. Picard
Assistant Examiner—Michael Datskovsky
(74) Attorney, Agent, or Firm—Dougherty & Troxell

(57) ABSTRACT

An electronic apparatus cooling device includes a casing, the casing defining a first air path and holding a fan in the first air path, a partition board mounted within the casing, the partition board having an opening in communication with the first air path, and holding a fan in a second air path defined therein, and a top plate covered on the casing, the top plate having a first suction hole sealed in air-tight communication with the first par path, and a second suction hole disposed in communication with the second air path.

1 Claim, 5 Drawing Sheets

ELECTRONIC APPARATUS COOLING DEVICE

BACKGROUND OF THE INVENTION

The present invention relates to an electronic apparatus cooling device, and more particularly to such an electronic apparatus cooling device, which comprises two fans disposed at different elevations in two independent air paths for quick dissipation of heat.

A regular computer mainframe has a fan installed in the AC adapter thereof. During operation, the fan carries heat away from the internal component parts of the computer mainframe to the outside. This cooling arrangement is less efficient. There is known a cooling device for computer, which comprises two fans installed in the front side of the computer mainframe, and operated to draw outside cold air into the inside of the computer mainframe. This design of cooling arrangement simply draws outside cold air into the inside of the computer mainframe to cool internal component parts of the computer mainframe. It cannot carry hot air out of the computer mainframe. Further, during the operation of the fans, the two flows of air may interfere with each other.

SUMMARY OF THE INVENTION

The invention has been accomplished under the circumstances in view. According to one aspect of the present invention, the cooling device uses two independent fans to carry heat away from the electronic apparatus in which the cooling device is installed. According to another aspect of the present invention, the fans work in a respective air path independently without causing interference.

DETAILED DESCRIPTION OF THE PREFERRED EMBODIMENT

Figure 1:
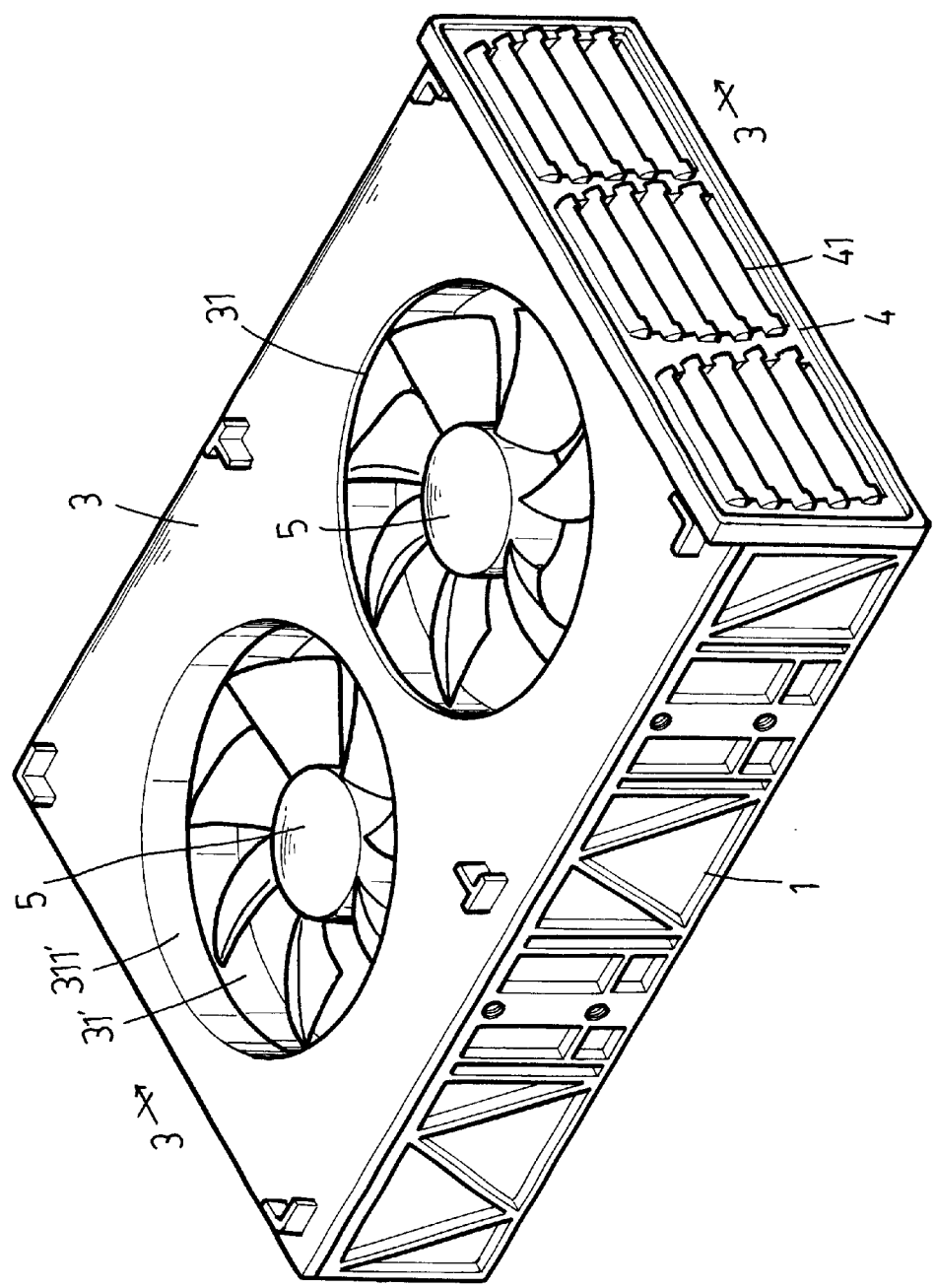
FIG. 1 is an elevational view of an electronic apparatus cooling device according to the present invention.

Referring to FIGS. from 1 through 3, an electronic apparatus cooling device in accordance with the present invention comprises a casing 1, a partition board 2, a top plate 3, a grille 4, and two fans 5. The casing 1 comprises a flat, rectangular bottom panel 11, and three peripheral walls 12 perpendicularly disposed around three sides of the four sides of the bottom panel 11. The peripheral walls 12 each comprise a coupling groove 121 at the top. The bottom panel 11 comprises a plurality of upright mounting posts 111 respectively disposed at the top side thereof in four corners, an open chamber 13 of substantially R-shaped profile extended to the open side of the casing 1, and an upright shaft 131 disposed in the open chamber 13 and adapted to hold one fan 5. The partition board 2 is mounted within the casing 1 and supported on the open chamber 13 and the upright mounting posts 111, comprising a plurality of through holes 23 corresponding to the upright mounting posts 111, an opening 22 corresponding to the fan 5 in the open chamber 13 of the casing 1, an open chamber 21 of substantially R-shaped profile extended to one side thereof, and an upright shaft 211 disposed in the open chamber 21 and adapted to hold one fan 5. The top plate 3 is covered on the casing 1 and spaced above the partition board 2, comprising a plurality of bottom mounting posts 33 respectively fastened to the through holes 23 of the partition board 2 and the upright mounting posts 111 of the casing 1 by screws, a first suction hole 31 corresponding to the fan 5 in the open chamber 21 of the partition board 2, a second suction hole 31' corresponding to the opening 22 of the partition board 2, and a bottom flange 311' raised from the bottom side wall thereof around the second suction hole 31' and engaged into the opening 22 of the partition board 2 to isolate the air path through the open chamber 13 of the casing 1 from the air path through the open chamber 21 of the partition board 2. The grille 4 is covered on the open side of the casing 1, having a plurality of air vents 41 for ventilation, and a plurality of hooks 42 respectively hooked in respective hook holes 112 of the casing 1 and respective hook holes 34 of the top plate 3.

Figure 2:
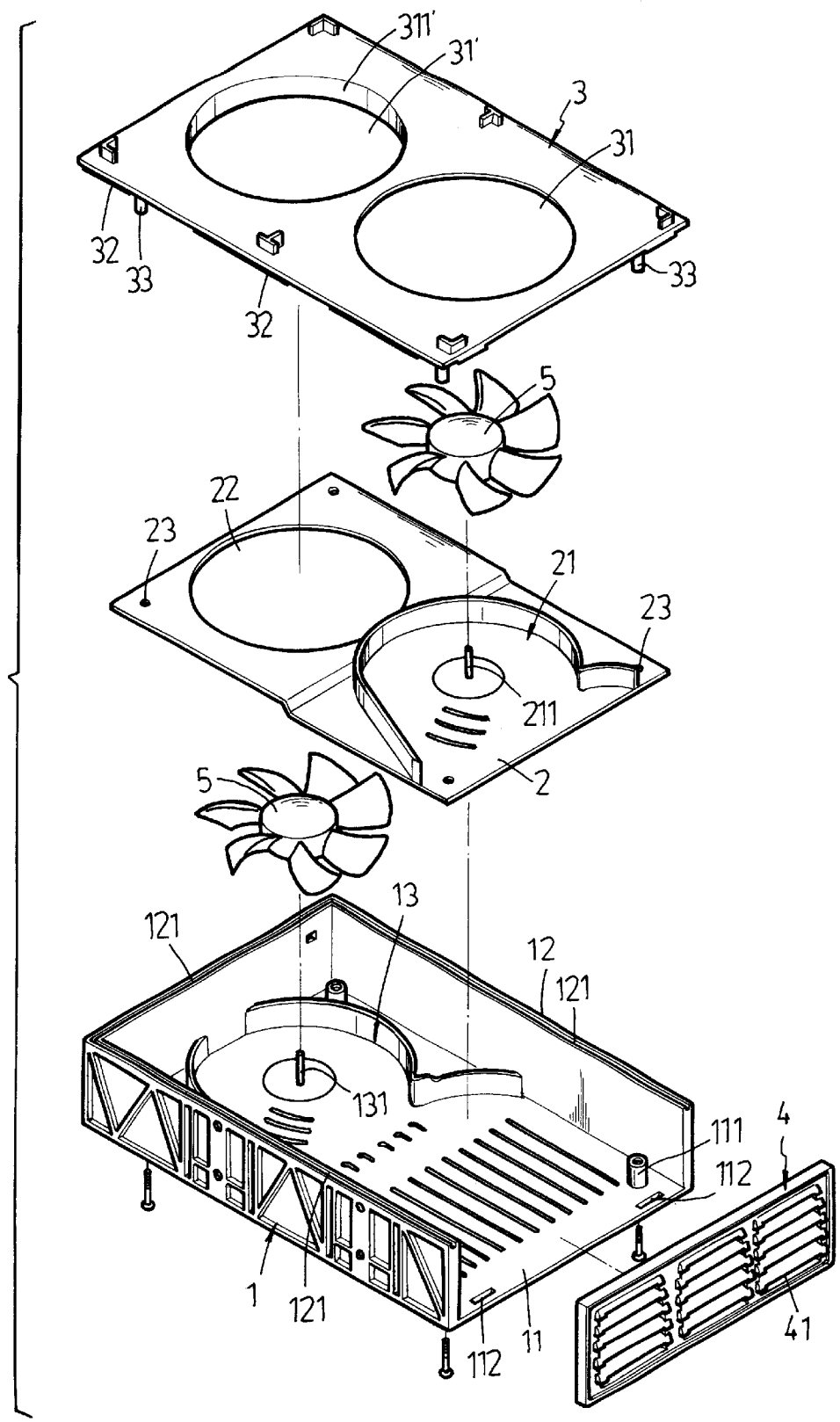
FIG. 2 is an exploded view of the electronic apparatus cooling device shown in FIG. 1.
Figure 3:
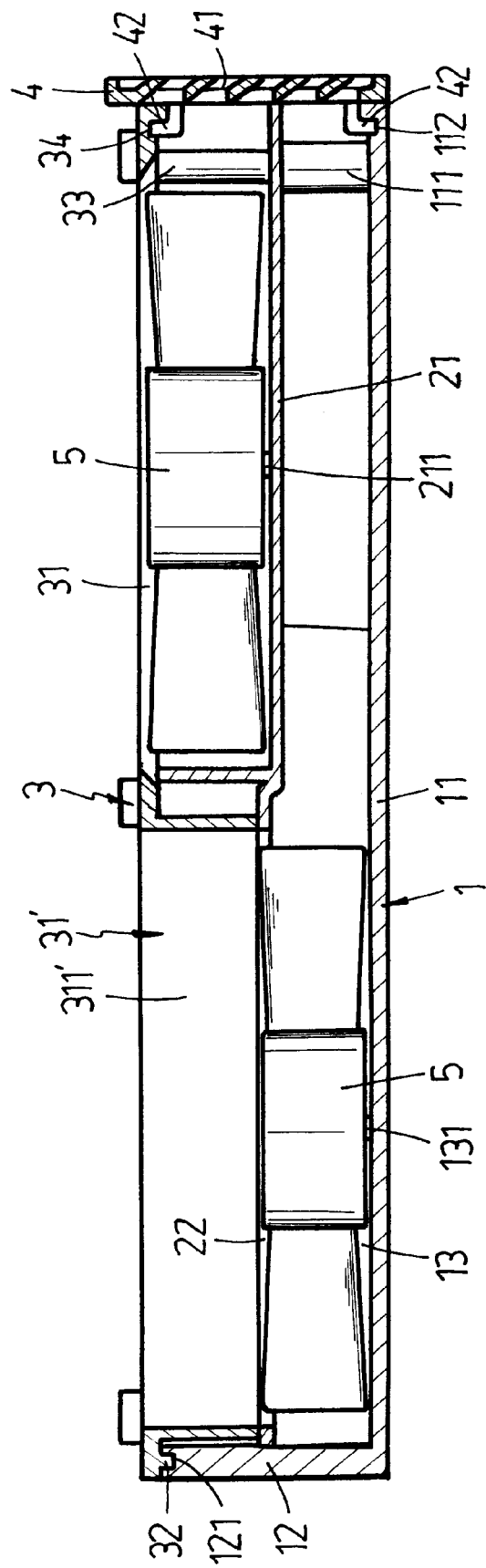
FIG. 3 is a sectional view taken along line 3—3 of FIG. 1.

Referring to FIGS. 2 and 3 again, the top plate 3 comprises a plurality of bottom coupling ribs 32 respectively fitted into the coupling grooves 121 of the peripheral walls 12 of the casing 1.

Figure 4:
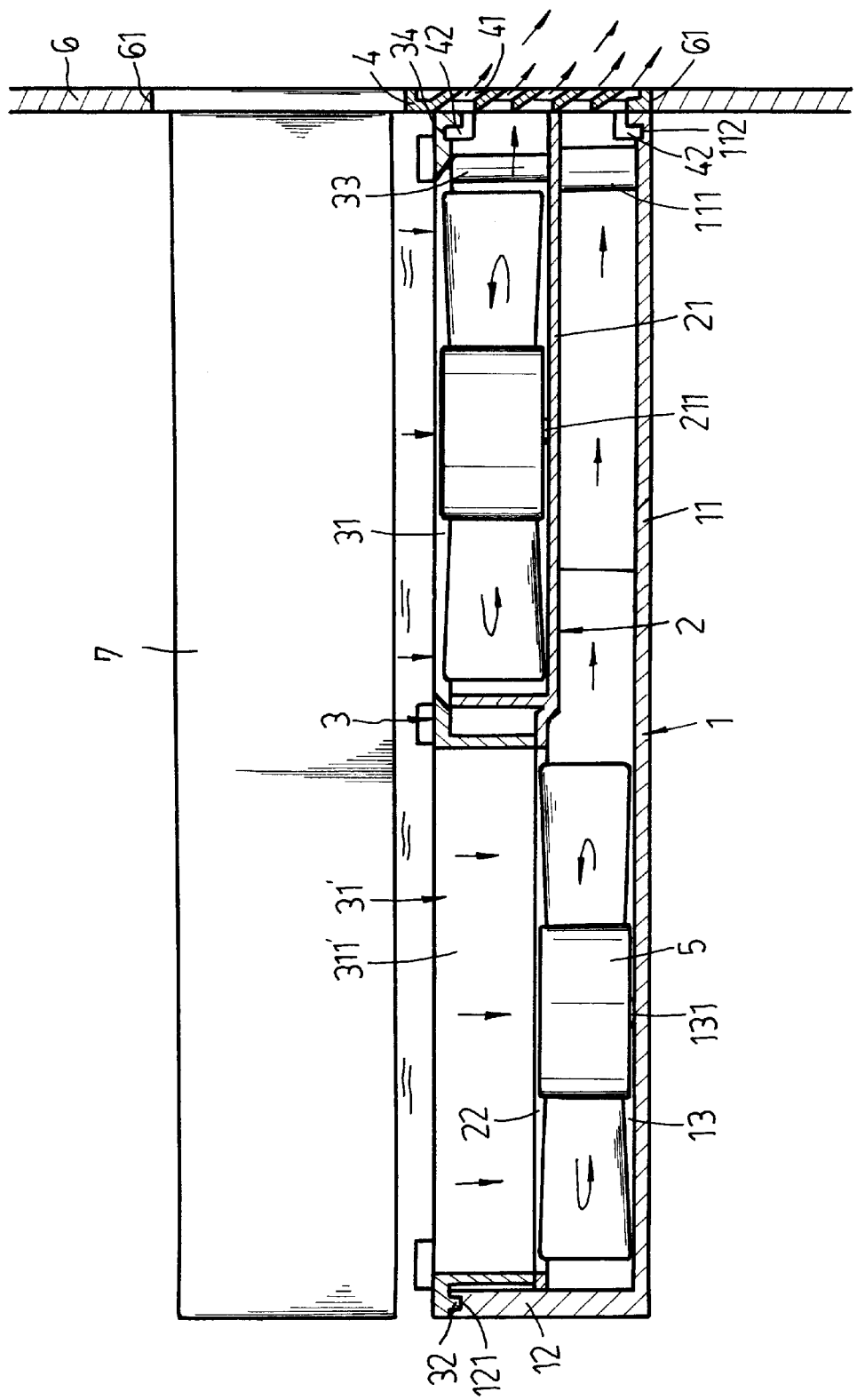
FIG. 4 is a schematic drawing showing the electronic apparatus cooling device installed in a computer main and operated according to the present invention.
Figure 5:
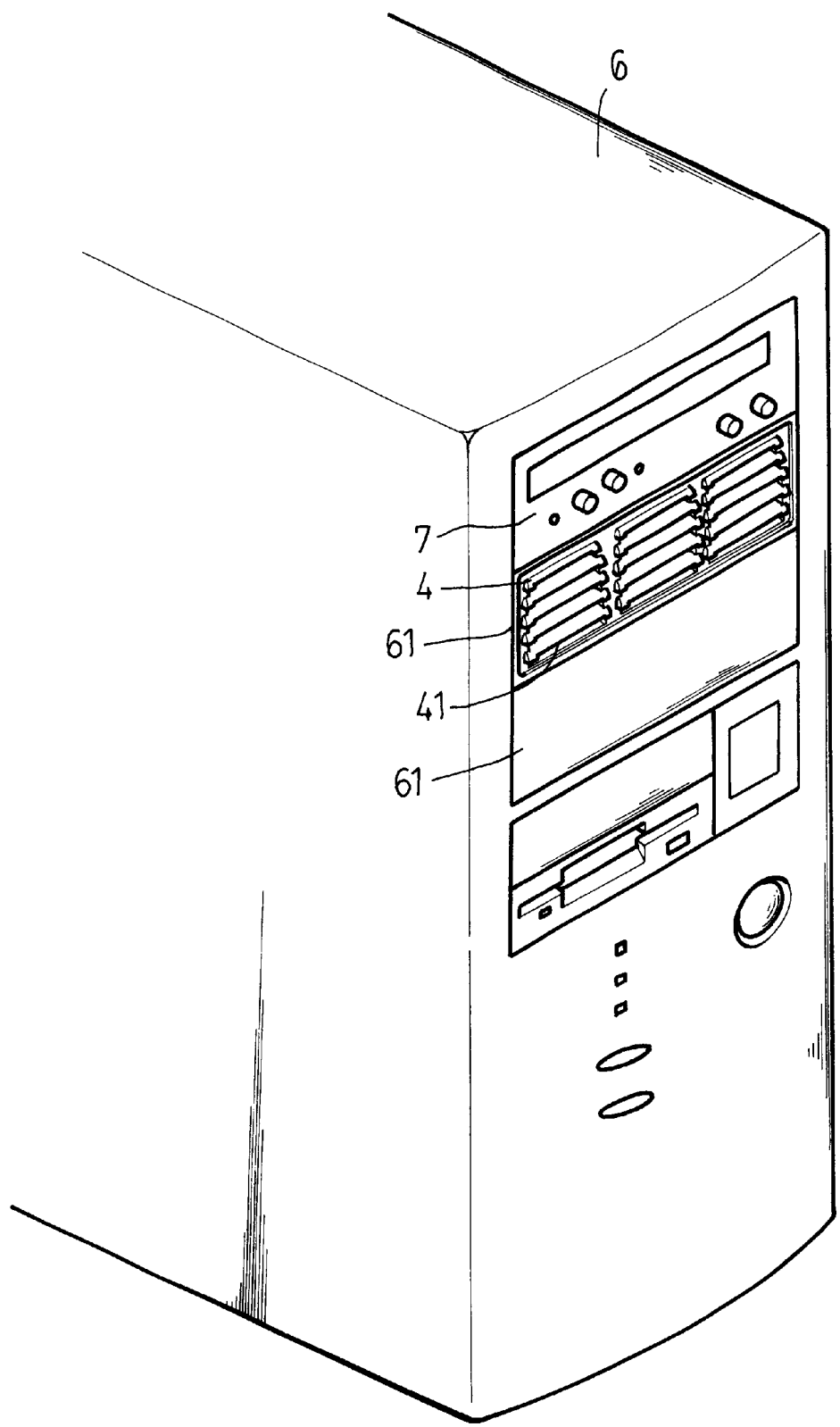
FIG. 5 is an elevational view showing the electronic apparatus cooling device installed in a computer mainframe according to the present invention.

Referring to FIGS. 4 and 5 and FIG. 1 again, the cooling device can be installed in a diskdrive slot 61 of a computer mainframe 6 below a hard diskdrive 7, and operated to carry heat away from the hard diskdrive 7 into the outside of the computer mainframe 6. During operation, the fans 5 are operated to induce a respective draft of air, and induced drafts of air flow independently without causing interference.

It is to be understood that the drawings are designed for purposes of illustration only, and are not intended for use as a definition of the limits and scope of the invention disclosed.

What the invention claimed is:

1. An electronic apparatus cooling device comprising:

a casing, said casing comprising a flat, rectangular bottom panel, and three peripheral walls perpendicularly disposed around three sides of the four sides of said bottom panel, said peripheral walls each comprising a top coupling groove, said bottom panel comprising a plurality of upright mounting posts respectively disposed at a top side thereof in four corners, an open chamber of substantially R-shaped profile extended to one side of said casing and defining an air path, an upright shaft disposed in the open chamber of said casing and holding a fan, and a plurality of hook boles near one side thereof;

a partition board mounted within said casing and supported on the open chamber and upright mounting posts of said casing, said partition board comprising a plurality of through holes respectively connected to the upright mounting posts of said casing, an opening corresponding to the fan in the open chamber of said casing, an open chamber of substantially R-shaped profile extended to one side thereof and defining an air path, and an upright shaft disposed in the open chamber of said partition board and holding a fan;

a top plate covered on said casing and spaced above said partition board, said top plate comprising a plurality of bottom mounting posts respectively fastened to the through holes of said partition board and the upright mounting posts of said casing by screws, a first suction hole corresponding to the fan in the open chamber of said partition board, a second suction hole corresponding to the opening of said partition board, a bottom flange raised from a bottom side wall thereof around said second suction hole and engaged into the opening of said partition board to isolate the air path of the open chamber of said casing from the air path of the open chamber of said partition board, a plurality of hook holes near one side thereof, and a plurality of bottom coupling ribs respectively fitted into the coupling grooves of said upright peripheral walls of said casing; and a grille covered on said casing at one side between two upright peripheral walls of said casing, said grille comprising a plurality of air vents for ventilation, and a plurality of hooks respectively hooked in the hook holes of said casing and the hook holes of said top plate.

* * * * *